United States Patent [19]

Feinstein

[11] Patent Number: 4,632,293
[45] Date of Patent: Dec. 30, 1986

[54] METHOD OF UPGRADING MEMORY BOARDS

[76] Inventor: Dov Y. Feinstein, 1669 S. Voss #880, Houston, Tex. 77057

[21] Appl. No.: 771,656

[22] Filed: Sep. 3, 1985

[51] Int. Cl.⁴ .................. B23K 31/02; H05K 3/00; H05K 3/34
[52] U.S. Cl. .................................. 228/119; 228/179; 29/829; 29/840
[58] Field of Search ............ 228/119, 170, 179; 339/17 CF; 174/52 FP; 29/825, 829, 840, 838, 839

[56] References Cited

U.S. PATENT DOCUMENTS 3,406,246 10/1968 Davidson et al. .................. 228/119
3,912,984 10/1975 Lockhart, Jr. et al. ........ 339/17 CF Primary Examiner—Kuang Y. Lin
Assistant Examiner—Samuel M. Heinrich

[57] ABSTRACT

A simple method of upgrading memory boards containing soldered memory chips by upward pin compatible memory chips with more memory. The new memory chips are soldered over the original memory chips after the power pins of the original chips have been disconnected and insulated from the original chips. This method is particularly useful for upgrading type "4164" 64Kb DRAM chips by type "4256" 256Kb DRAM chips.

7 Claims, 4 Drawing Figures

METHOD OF UPGRADING MEMORY BOARDS

BACKGROUND OF THE INVENTION

1. Field of the Invention

This invention relates to a simple method of upgrading memory boards by attaching upward pin compatible memory chips with more memory capacity over the existing memory chips.

2. Description of the Prior Art

The increasing demand of denser memory chips for computers and other memory dependent devices brought forth an unprecedented improvement of such memory chips. While the state of the art DRAM chips contained 16K bits 4 years ago, today's standard are the 256Kb memory chips, with samples of 1Mb memory chips already appearing from various suppliers. This race for denser memory chips rendered memory boards obsolete within a year or two after their introduction to the market. To avoid this problem, design of the standard "4164" 64Kb DRAM chip within the 16 DIP package made use of pins no. 2 to 16, reserving pin no. 1 for use by the "4256" 256Kb DRAM chip. Under such upward pin compatibility between subsequent generations of DRAM ship design, it became possible to quadruple memory boards having 64Kb chips by replacing the 64Kb chips with 256Kb chips.

Most initial design of the memory boards with the 64Kb chips provided for easy replacement of the 64Kb chips with the new 256Kb chips by inserting the original chips in DIP sockets. Yet some boards used soldered 64Kb chips which require delicate and expansive desoldering work for replacing the 64Kb chips. For instance, such problem exists within the successful "Macintosh" computer of the Apple Computer Company. This computer has 16 units of "4164" 64Kb memory chips soldered on the 4 layer complex main logic board. The desoldering process of these 16 memory chips is very delicate and require expansive desoldering machines. With the reduction in the price of the 256Kb chips, many "Macintosh" owners had to pay three to four times the price of each chips to have their boards upgraded by professional technicians. Other solutions of the prior art include the addition of a second memory board with 256Kb chips onto the original "Macintosh" board. This solution has the disadvantage of extra cost of the additional board and there is still the need to desolder several IC chips.

BRIEF DESCRIPTION OF THE INVENTION

It is the primary object of the present invention to provide a simple method to upgrade soldered 64Kb RAM chips by cutting the two pins of each chip which provides power to the 64Kb DRAM chip, and by attaching the new 256Kb DRAM chips over the existing 64Kb DRAM chips so that the power from the board is connected only to the 256Kb DRAM chips and thus disabling the 64Kb DRAM chips. Such method is also intended for the upgrading of any other type of soldered memory chips by upward pin compatible denser memory chips.

It is a another object of the present invention to enable nonprofessional users to upgrade their own memory board with only an inexpensive soldering iron.

It is a further object of the present invention to prevent the need of fine desoldering of heavily populated Multilayer Printed Circuit boards while upgrading soldered memory chips.

With the above and other objects in view, the present invention will become more apparent when taken in conjunction with the following description and attached drawings, wherein like characters indicate like parts, and which drawings form a part of the present invention.

DETAILED DESCRIPTION OF THE PREFERRED EMBODIMENT

Figure 1:
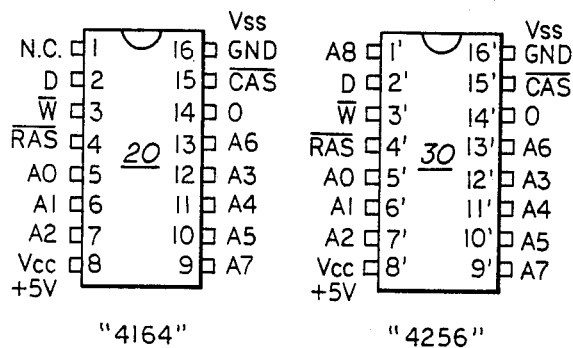
FIG. 1 illustrates the pin assignments of the standard 16 pin DIP "4164" 64Kb and the "4256" 256Kb DRAM chips.

Now with more particular reference to the drawings, FIG. 1 illustrates the pin assignments of a standard 64Kb DRAM chip 20 of the type "4164" and a standard 256Kb DRAM chip 30 of the type "4256". Those chips are being manufactured by a variety of manufacturers and may have accordingly different part number markings like TMS164, F4164, MT4264, 2164, MCM6665, NMC4164, MSM3764, or MSM3764 for the 64Kb DRAM chip and like TMS4256, MB81256, MSM4256, MCM6256, MSM37256, TMM41256, or WCM41256 for the 256Kb DRAM chip. In their most popular version these chips are encapsulated within the standard 16 Dual In-line Package (DIP). The pins of the "4164" memory chip are marked with referral numerals 1 to 16 and the pins of the "4256" memory chip are marked with referral numerals 1' to 16'. It is quite obvious that these two type of memory chips have identical physical shapes, and almost identical pin assignments with the exception that pin 1, which is not used in the "4164" chip 20, serves as the ninth multiplexed address line A8 of the "4256" chip 30.

As described above, the replacement of the "4164" chip by the "4256" chip is trivial in most of those cases where the original chips are connected to their boards by sockets, and pin 1 in all the sockes is already connected so that it can be activated by the proper ninth address line multiplexer. The present invention solves the problem of those boards with soldered memory chips, as in the 128K "Apple Macintosh" computer and in many other boards.

Figure 2:
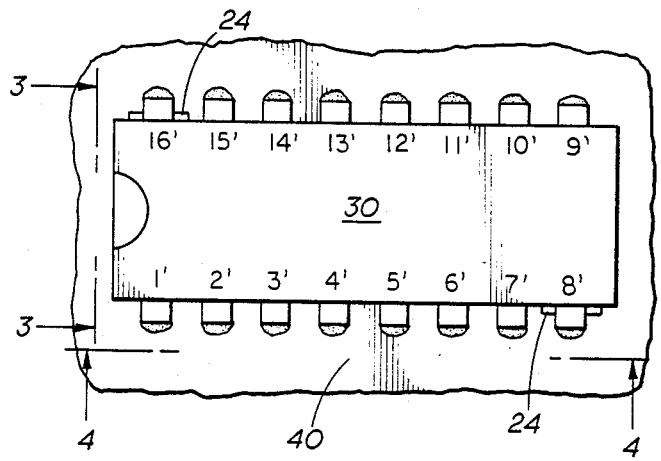
FIG. 2 is a top view illustrating the attachment of the 256Kb DRAM chip on top of the 64Kb DRAM chip in accordance with the method of the present invention.
Figure 3:
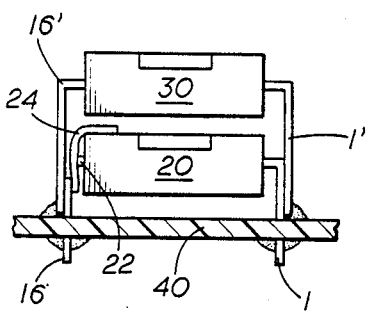
FIG. 3 is a cross-sectional view taken generally along line 3—3 of FIG. 2.
Figure 4:
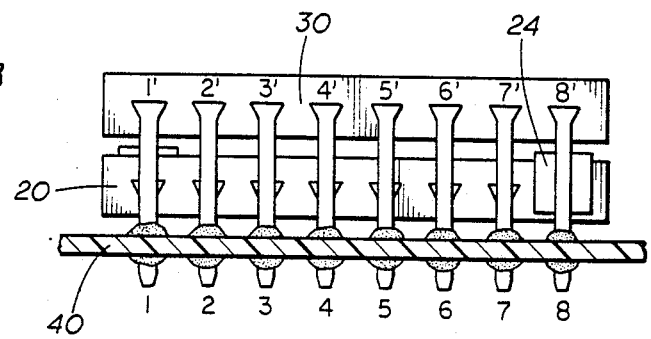
FIG. 4 is another cross-sectional view taken generally along line 4—4 of FIG. 2.

FIGS. 2–4 provide three different views on the method of attaching the new "4256" memory chip 30 over the existing "4164" memory chip 20. FIG. 2 is a top view showing the top of the "4256" memory chip 30 and part of the multilayer printed circuit board 40. The "4164" memory chip 20 is under the "4256" memory chip and is not shown in this figure. FIG. 3 is a cross-sectional view taken generally along line 3—3 of FIG. 2, and FIG. 4 is another cross-sectional view taken generally along line 4—4 of FIG. 2.

The process starts by first cutting the ground connection pin no. 16 of the existing "4164" chip 20 with a sharp and flat cutter. The cut is done as close as possible to the body of the chip 20 so that only a small part 22 remains attached to the chip. The main part of the cut pin 16 is left soldered to the memory board 40. This part is slightly bent away from the body of the chip 20 so that the small part 22, which is slightly protruding from the body of the chip, can be smoothed out by pushing it toward the body of the chip 20 with a long nose plier. It is also possible to smooth it out by a variety of filing techniques. The smoothed part 22 is then being insulated so that it will not touch accidentally pin 16' of the new "4256" memory chip which is placed on the old "4164" memory chip in the next step. This insulation can be made by placing a small plastic insulator 24 which adequately covers the smoothed part 22. A small peice of salf adhesive P.V.C. insulating tape is very suitable for this task. Another possibility is applying some insulation liquid over the smoothed part 22. The pin 16 is shortened by cutting a few millimeter of its top and it is then straightened against the insulation 24. The same process is repeated with the +5 V power supply pin no. 8 of the "4164" memory chip 20. While it is suffice to neutralize the "4164" memory chip by disconnecting only one of the power supply pins, it is safer to disconnect both power pins 8 and 16 of the "4164" chip.

The new "4256" memory chip 30 is placed on top of the disabled "4164" memory chip 20 in a parallel fashion so that the pins of the "4256" memory chip touches the corresponding pins of the lower chip. The power supply pins 8' and 16' touch the corresponding cut pins 8' and 16', but they are insulated from the "4164" memory chip due to the insulation process. All the pairs of corresponding pins are easily soldered together by using low wattage soldering iron with thin and long soldering head. When the original "4164" memory chips are spaced very closed together, the "Weller" 12W pencil-thin iron model WM120 or equivalent can be used. In most other cases, including the 128K "Apple Macintoch" computer, standard soldering iron can be used with thin and long tips like the "Weller" PTK7, "Ungar" #PL-L388 and their equivalents. After soldering pin 8' to pin 8 and pin 16' to pin 16 it is possible to slightly bend pins 8 and 16 from the body of the "4164" to improve the insulation. In fact, this bending step can be used instead of the insulation step so that there will be only air gap insulation between these pins and the "4164" chip.

The upgrading process is performed, of course, on all the "4164" memory chips of the upgraded memory board. In all cases of memory board upgrade in accordance with present invention, it is also necessary to provide for the additional addressing lines of the new memory chips. This problem is usually being taken into consideration in the original design of the memory board, and occasionally a multiplexer chip should be added.

While the method of the present invention is described herein in connection with the standard 64Kb DRAM and the 256Kb DRAM chips, the method is also useful with other types of upward pin compatible chips. Further, it should be apparent that various alterations, changes and modifications to the present method may be made without departing from the spirit and scope of the present invention as claimed in the appended claims.

I claim:

1. The method of upgrading memory boards by bypassing a first soldered memory chip by an upward pin compatible second memory chip having a larger memory capacity, which comprises:
   cutting at least one of the power supply pins of said first memory chip at the closest point to the body of said first memory chip;
   insulating said cut pins from the part of the pins which remain attached to the body of said first memory chip;
   placing said second memory chip on top of said first memory chip so that the pins of said second memory chip touch the corresponding pins of said first memory chip and soldering all adjacent pair of pins together.

2. The method as recited in claim 1, wherein slightly shortening said cut pins so that they will not touch said parts of said cut pins which remain attached to the body of said first memory chip.

3. The method as recited in claim 1, wherein tightly bending said parts of said cut pins which remain attached to the body of said first memory chip toward the body of said first memory chip.

4. The method as recited in claim 1, wherein filing off said parts of said cut pins which remain attached to the body of said first memory chip.

5. The method as recited in claim 1, wherein said insulating step comprises the insertion of small pieces of self adhesive insulation band between the cut pins and the body of said first memory chip.

6. The method as recited in claim 1, wherein said insulating step comprises the application of liquid insulation material over said parts of said cut pins which remain attached to the body of said first memory chip.

7. The method as recited in claim 1, wherein said insulation step is performed after the soldering step by bending the soldered power pins of said second memory chip away from said cut pins which remain attached to the body of said first memory chip.

* * * * *